US008443262B2

(12) United States Patent
Foley (10) Patent No.: US 8,443,262 B2
(45) Date of Patent: *May 14, 2013

(54) ADAPTIVE MEMORY SCRUB RATE

(75) Inventor: John A. Foley, Apex, NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/551,451

(22) Filed: Jul. 17, 2012

(65) Prior Publication Data

US 2012/0284575 A1 Nov. 8, 2012

Related U.S. Application Data

(63) Continuation of application No. 12/214,283, filed on Jun. 18, 2008, now Pat. No. 8,255,772.

(51) Int. Cl.
*G11C 29/42* (2006.01)
*G11C 29/54* (2006.01)

(52) U.S. Cl.
USPC .......................................... 714/764; 714/718

(58) Field of Classification Search .................. None
See application file for complete search history.

(56) References Cited

U.S. PATENT DOCUMENTS

| 5,099,484 | A | 3/1992 | Smelser |
| 5,632,012 | A | 5/1997 | Belsan et al. |
| 7,171,610 | B2 | 1/2007 | Ash et al. |
| 7,275,130 | B2 | 9/2007 | Klein |
| 7,328,380 | B2 | 2/2008 | Pomaranski et al. |
| 7,383,749 | B2 | 6/2008 | Schafer et al. |
| 2003/0034541 | A1* | 2/2003 | Essick et al. .................. 257/505 |
| 2006/0267653 | A1 | 11/2006 | Fulkerson |

OTHER PUBLICATIONS

Foley, John A.: "Adapative Memory Scrub Rate"; U.S. Appl. No. 12/214,283, filed Jun. 18, 2008.

* cited by examiner

*Primary Examiner* — Ajay Bhatia
*Assistant Examiner* — Dipakkumar Gandhi
(74) *Attorney, Agent, or Firm* — Patterson & Sheridan, LLP (57) ABSTRACT

In one embodiment an example apparatus includes a memory with an error detection system (EDS) that detects an error event in the memory. The error event involves at least one bit in the memory changing state erroneously. The apparatus also includes a scrub logic to scrub the memory and correct memory errors (e.g., bit errors). The apparatus also includes a scrub rate adaptive logic to selectively control a memory scrub frequency associated with the scrub logic where the control is based, at least in part, on a number of error events detected by the EDS during an interval of time. A memory scrub frequency is the rate that a memory is periodically scrubbed to remove errors.

17 Claims, 7 Drawing Sheets

ADAPTIVE MEMORY SCRUB RATE

CROSS REFERENCE TO RELATED APPLICATIONS

This patent application is a continuation of U.S. patent application Ser. No. 12/214,283, now U.S. Pat. No. 8,255,772 filed Jun. 18, 2008, which is incorporated herein by reference in its entirety.

TECHNICAL FIELD

This disclosure relates generally to adjusting a memory scrub frequency. More specifically, the disclosure relates to detecting memory error events during an error checking interval (ECI) and adjusting the memory scrub frequency to periodically remove errors from the memory at a rate responsive to the error event rate.

BACKGROUND

Conventional error mitigation strategies utilize fixed memory scrub frequencies that are set according to the expected rate of error events. These conventional strategies ignore the realities that the actual error event rate of a memory will vary over time. Some devices are located in environments where error event rates vary over time. For example, when a digital circuit is moved to different locations, its error event rate may change due to the variation of radiation between locations. By way of illustration, digital circuits deployed in space may experience varied amounts of radiation over time due, for example, to solar flares. Solar flare frequency generally varies over an eleven year cycle with radiation often spiking during a short interval of that cycle. Thus, conventional error mitigation strategies may employ a very high fixed memory scrub frequency in order to account for expected spikes in the error event rate during short intervals. This results in excessive use of processor cycles for memory scrubs during long periods of low error event rates.

A memory error event may occur when digital circuits are exposed to radiation in the form of high energy particles including energetic electrons and protons. Strategies to mitigate these error events may be used when deploying digital circuits into radiation prone environments including, for example, medical offices, battlefields, nuclear facilities, earth orbit, beyond earth orbit, other radiation intensive environments, and so on. Additionally, as digital circuits become smaller and more densely packed, error events become more common even in less radiation prone environments. These error events may occur without radiation due, for example, to power fluctuations. Applications that are mathematically intensive may be less resistant to occasional errors in the memory, thus these applications may desire perfect memory accuracy.

One typical mitigation strategy deployed in digital circuits includes periodically scrubbing the memory by activating the error corrective code (ECC) system in the memory. Errors may also be identified and corrected by memory scrub logics.

BRIEF DESCRIPTION OF THE DRAWINGS

In the accompanying drawings, which illustrate various embodiments, it will be appreciated that the illustrated element boundaries (e.g., boxes, groups of boxes, or other shapes) are representative and not limiting. One of ordinary skill in the art will appreciate that in some embodiments one element may be designed as multiple elements, that multiple elements may be designed as one element, that an element shown as an internal component of another element may be implemented as an external component and vice versa, and so on. Furthermore, elements may not be drawn to scale.

OVERVIEW

In one embodiment, memory scrub frequency may be adjusted based on feedback from an error corrective code (ECC) system utilized by a memory for error detection. References to "one embodiment", "an embodiment", "one example", "an example", and so on, indicate that the embodiment(s) or example(s) so described may include a particular feature, property, element, or limitation, but that not every embodiment or example necessarily includes that particular item. Repeated use of the phrase "in one embodiment" does not necessarily refer to the same embodiment, though it may. The memory scrub frequency may be initialized at a default scrub frequency. The initial memory scrub frequency may be based, for example, on an expected error event rate. The memory scrub frequency may be selectively adjusted by example systems and methods as error rates increase and/or decrease. For example, when increased numbers of error events are detected, the memory scrub frequency may be increased by a first scrub rate delta. One embodiment may calculate a total number of error events (TNEE) during a threshold window of time. If during a threshold window of time the TNEE exceeds a dynamic random access memory (DRAM) error threshold value, the memory scrub frequency may be increased by the first scrub rate delta. Similarly, when the TNEE detected by the ECC system decreases, the memory scrub frequency may also be decreased. For example, when the TNEE detected by the ECC during a scrub retry period is less than a minimum error threshold value, the memory scrub frequency may be decreased by a second scrub rate delta.

Embodiments presented in this disclosure include an apparatus with an error detection system (EDS) that detects an error event in a volatile memory where the error event involves at least one bit in the volatile memory changing states erroneously. The apparatus includes scrub logic to scrub the volatile memory to correct an error in the volatile memory and scrub rate adaptive logic (SRAL) to selectively control a memory scrub frequency associated with the scrub logic by comparing a number of error events detected by the EDS to a plurality of error count thresholds. Moreover, each of the plurality of error count thresholds is associated with a respective scrub frequency change and the SRAL varies the memory scrub frequency based on a rate derived from at least one of the respective scrub frequency changes associated with at least one of the plurality of error count thresholds satisfied by the number of error events.

Another embodiment presented in this disclosure includes a method that detects an error event in a volatile memory where the error event involves at least one bit in the volatile memory changing states erroneously. The method includes correcting an error in the volatile memory based on scrub logic and selectively controlling a memory scrub frequency associated with the scrub logic by comparing a total number of error events detected during an error checking interval (ECI) to a plurality of error count thresholds. Moreover, each of the plurality of error count thresholds is associated with a respective scrub frequency change. The method further includes varying the memory scrub frequency based on a rate derived from at least one of the respective scrub frequency changes associated with at least one of the plurality of error count thresholds satisfied by the number of error events.

Another embodiment presented in this disclosure includes an apparatus that includes an error detection system (EDS) to detect an error event in a random access memory (RAM), where the error event involves at least one bit in the RAM changing state erroneously. The apparatus includes scrub logic to scrub the RAM to correct an error in the RAM and scrub rate adaptive logic (SRAL) to selectively control a memory scrub frequency associated with the scrub logic based, at least in part, on comparing a number of error events detected by the EDS during an error checking interval (ECI) to an error threshold. Moreover, at least one of: (i) a duration of the ECI and (ii) the error threshold is varied based on the memory scrub frequency, and a rate at which the memory scrub frequency is changed is based on the degree to which the number of error events one of: exceeds the error threshold and falls below the error threshold.

DESCRIPTION OF EXAMPLE EMBODIMENTS

Example embodiments concern adapting a memory scrub frequency to mitigate memory error events in an efficient manner by matching the memory scrub frequency to a corresponding error event rate. An error event may occur when a digital circuit is exposed to energetic electrons, energetic protons, and other radiation. Additionally, other factors, (e.g., power fluctuations, component density) may contribute to error events. A memory scrub frequency controls how often errors are corrected by a memory scrub. Memory scrubs may use large quantities of processor cycles. Thus, processor cycles allocated to maintaining data accuracy by memory scrubbing may be balanced against processor cycles available for other uses. Adapting memory scrub frequency facilitates making this balance. An adjustable memory scrub frequency mitigates the effects of error events due to solar flares and other celestial events when increased memory scrub frequencies are needed to correct error events while decreasing processor cycles used for memory scrubbing when error event rates decrease.

Figure 1:
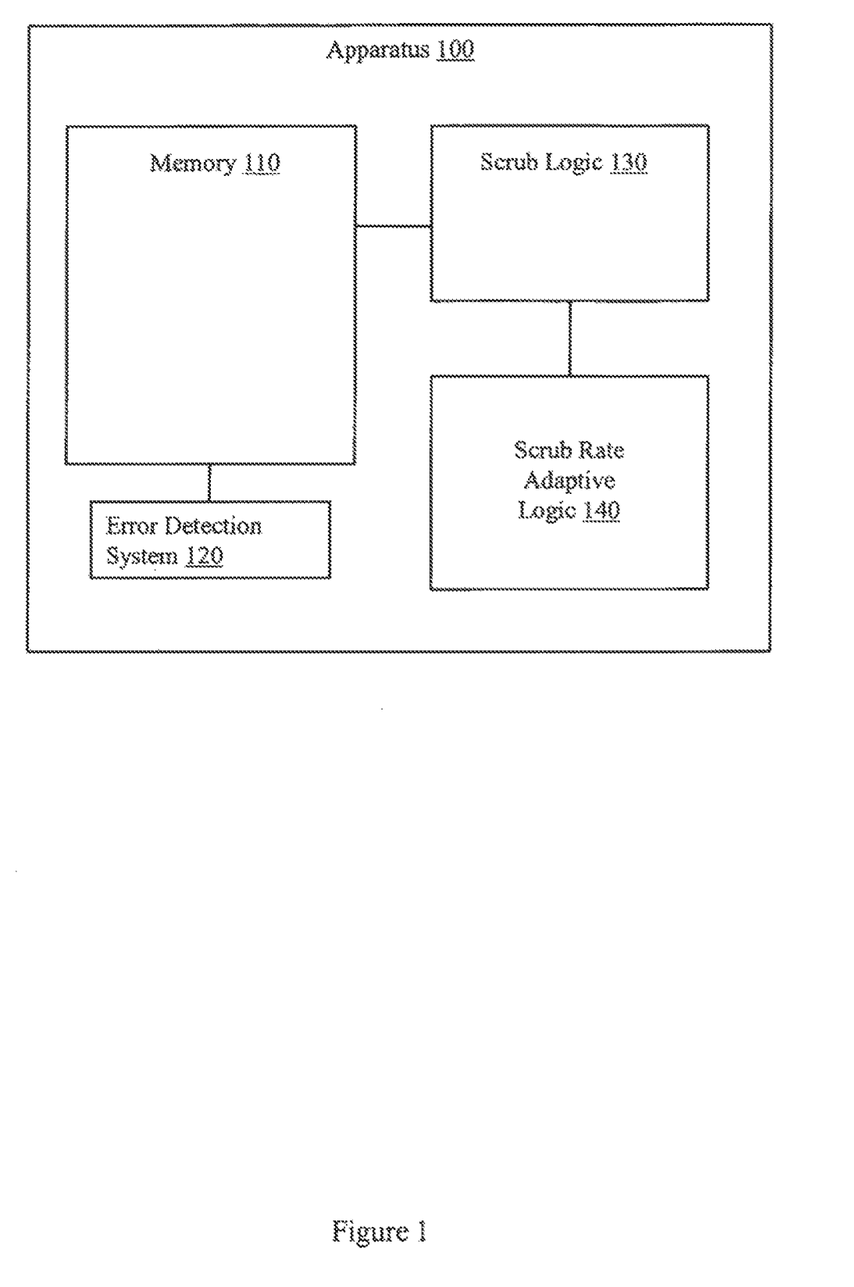
FIG. 1 illustrates an example apparatus that includes a memory with an error detection system, a scrub logic for scrubbing the memory of errors, and a scrub rate adaptive logic for selectively adjusting a memory scrub frequency.

Error detecting and correcting memories may use dynamic memory scrub rate adaptations as described herein. Thus, FIG. 1 illustrates an apparatus 100 that selectively adjusts memory scrub frequency. The apparatus 100 may include a memory 110. The memory 110 may include random access memory (RAM), dynamic random access memory (DRAM), synchronous random access memory (SRAM), and so on.

The apparatus 100 may also include an error detection system (EDS) 120. In one example, the EDS may reside in a memory management unit. The EDS 120 includes logic to detect an error event in memory 110. When an error is detected, an interrupt may be generated and a time stamp associated with the error may be generated and/or stored. For example, if a single bit in a byte of memory 110 were to change state erroneously, EDS 120 may detect the single bit error using an ECC check. EDS 120 may also include logic to detect multiple error events within the same byte. While a "byte" is described, it is to be appreciated that more generally an "addressable unit" (e.g., nibble, byte, word, long word) may be processed. "Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., application specific integrated circuit (ASIC)), an analog circuit, a digital circuit, a programmed logic device, a memory device containing instructions, and so on. Logic may include a gate(s), combinations of gates, or other circuit components.

The apparatus 100 may also include a scrub logic 130 that corrects errors in memory 110 after the memory 110 changes state erroneously. In some instances the memory 110 may be returned to an error free state after a single bit in a byte of memory 110 changes state erroneously as in a single event upset. However, in other instances scrub logic 130 may correct multiple error events even when the errors are present in a single byte. An erroneous change of state may be caused, for example, by cosmic rays, alpha particles, radio frequency interference, power fluctuations, static electricity discharges, faulty components, improper system timing, radiation originating from below the surface of the earth, radiation originating from the atmosphere of the earth, radiation originating above one hundred kilometers from the surface of the earth, component density, and so on. While scrub logic 130 is illustrated external to memory 110, one skilled in the art will appreciate that in some examples the scrub logic 130 may be internal to memory 110, to EDS 120, or to both.

The EDS 120 may employ a single bit Hamming error detection scheme while the scrub logic 130 may employ a single bit Hamming error correction scheme. Additionally, the EDS 120 may employ a multiple bit Reed-Solomon error detection scheme and the scrub logic 130 may employ a multiple bit Reed-Solomon error correction scheme. One skilled in the art will appreciate that other detection and correction schemes may be employed.

The apparatus 100 may also include a scrub rate adaptive logic (SRAL) 140 that selectively controls the memory scrub frequency. The memory scrub frequency is the rate at which the scrub logic 130 periodically scrubs the memory 110. The SRAL 140 may gather and/or total error events reported by the EDS 120 during a time interval. The SRAL 140 may adjust the memory scrub frequency by a scrub rate delta based, at least in part, on the reported TNEE during the time interval. The TNEE during the time interval is the feedback from the EDS 120 that allows the SRAL 140 to determine if the error event rate exceeds a maximum threshold or is less than a minimum threshold. If the error event rate exceeds a threshold, then an adjustment of the memory scrub frequency may be made.

For example, assume the SRAL 140 is programmed with a maximum error threshold of five error events during a time interval and a minimum error threshold of two error events during the time interval. The following two examples with different total actual reported error events by the EDS illustrate processing performed by SRAL 140. First, if the EDS 120 reports six actual error events in the memory 110 during the time interval, the memory scrub frequency may be increased by a scrub rate delta. Second, if the EDS 120 reports one actual error event in the memory 110 during the time interval, the memory scrub frequency may be decreased by a scrub rate delta. The scrub rate delta for an increase may differ from the scrub rate delta for a decrease. Additionally, the scrub rate delta for increases and/or decreases may be changed based, at least in part, on the memory scrub frequency. While the SRAL 140 is illustrated external to memory 110, one skilled in the art will appreciate that in some instances the SRAL 140 may be internal to the memory 110, to the EDS 120, to the scrub logic 130, or to a combination thereof.

Figure 2:
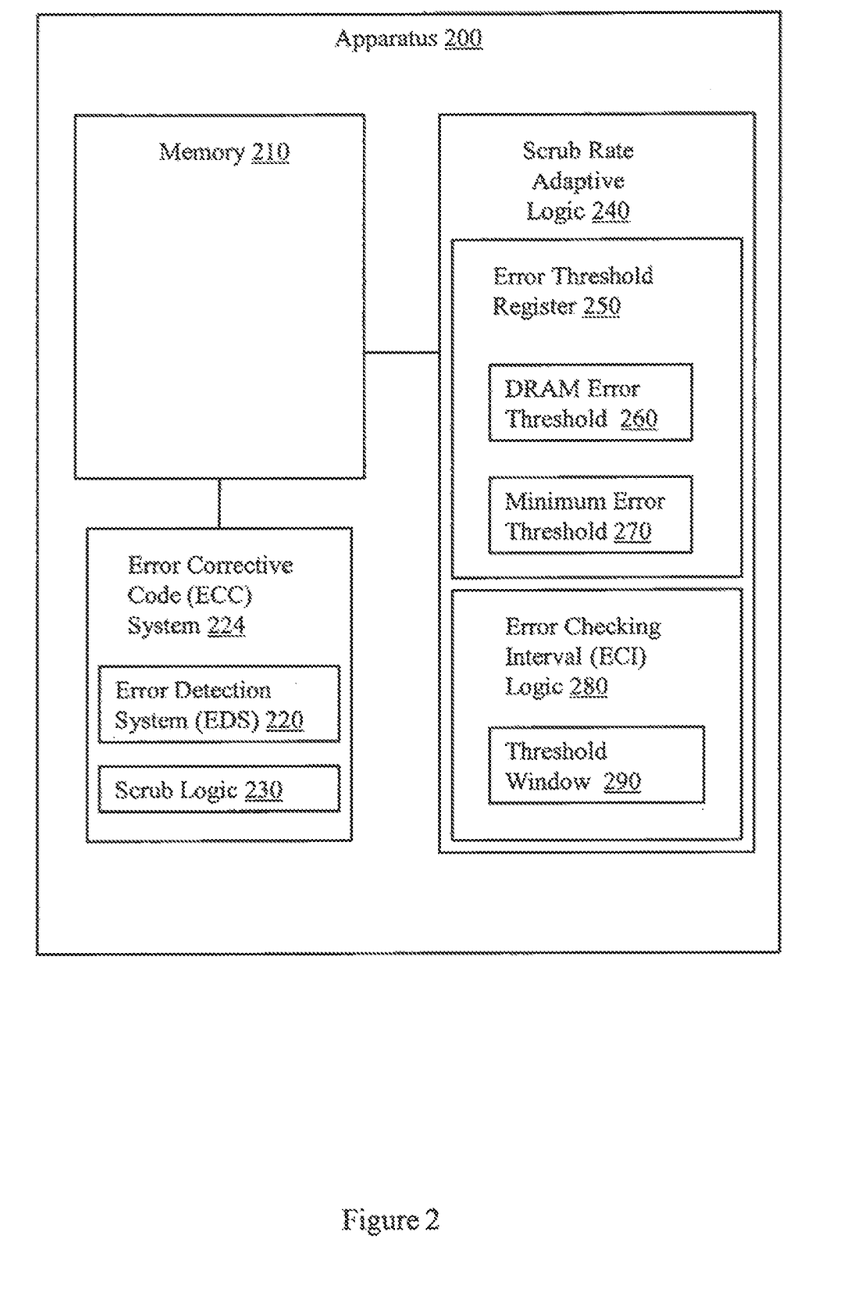
FIG. 2 illustrates another example apparatus that includes a memory with an error detection system, a scrub logic for scrubbing the memory of errors, and a scrub rate adaptive logic for selectively adjusting a memory scrub frequency.

FIG. 2 illustrates an apparatus 200 that selectively adjusts a memory scrub frequency. Apparatus 200 includes some components that are similar to those described in connection with apparatus 100 (FIG. 1). For example, apparatus 200 includes a memory 210, an error detection system (EDS) 220, a scrub logic 230, and a scrub rate adaptive logic (SRAL) 240. However, apparatus 200 also includes additional components.

For example, apparatus 200 includes an error corrective code (ECC) system 224 that may include the EDS 220 and the scrub logic 230. The ECC system 224 may detect errors using EDS 220 and may correct errors using scrub logic 230.

The ECC system 224 includes logic to detect and correct an error event in the memory 210. For example, if a single bit in a byte of memory 210 changed state erroneously, the ECC system 224 may detect and correct the single bit error using an ECC check. Additionally, the ECC system 224 may include logic to detect and correct multiple error events within the same byte. Another example ECC system 224 may detect multiple bit errors in a byte of the memory 210 while only correcting single bit errors in the byte. This is known by those skilled in the art as multiple detect, single correct.

The apparatus 200 may include an error threshold register 250. The error threshold register 250 may store a dynamic random access memory (DRAM) error threshold 260. The error threshold register 250 may also store a minimum error threshold 270. Actual error counts may be checked against the thresholds in register 250 to determine whether to increase or decrease a scrub frequency.

The apparatus 200 may include an error checking interval (ECI) logic 280. The ECI logic 280 may store a threshold window 290. The threshold window 290 may be the actual ECI that is the time interval used by the ECI logic 280. The ECI logic 280 and/or the SRAL 240 may collect time stamps of the memory error events entered in a first-in-first-out (FIFO) queue. While a FIFO is described, it is to be appreciated that other data structures may be employed. The error events may have been stored in the data structure by the EDS 220. Entries older than the threshold window 290 may be purged. The number of error events in the FIFO may then be totaled to calculate a TNEE during the threshold window 290. For example, the calculation of the TNEE may be used by the SRAL 240 to determine whether the memory scrub frequency is to be adjusted. The ECI logic 280 may also set and adjust the threshold window 290 for which a TNEE is calculated and totaled.

The SRAL 240 may selectively control the memory scrub frequency similarly SRAL 140 (FIG. 1). The memory scrub frequency is the rate at which the scrub logic 230 periodically scrubs the memory 210. The SRAL 240 may gather and/or total the TNEE reported by the ECC system 224 during a threshold window 290 time interval. The SRAL 240 may adjust the memory scrub frequency by a scrub rate delta based, at least in part, on the reported TNEE during the threshold window 290. The TNEE during the threshold window 290 is the feedback from the ECC system 224 that allows the SRAL 240 to determine if the error event rate exceeds a maximum threshold or is less than a minimum threshold. The maximum threshold may be the DRAM error threshold 260. The minimum threshold may be the minimum error threshold 270. These thresholds and the TNEE may be used by the SRAL 240 to determine whether to make an adjustment to the memory scrub frequency.

The following two examples with different TNEE reported by the ECC system 224 to the SRAL 240 illustrate adjusting the memory scrub frequency using the SRAL 240. By way of illustration, assume that the SRAL 240 was programmed with a DRAM error threshold 260 of five error events during the threshold window 290 and a minimum error threshold 270 of two error events during the threshold window 290. The first example includes the ECC system 224 reporting six actual error events in the memory 210 during the threshold window 290 resulting in the memory scrub frequency being increased by the SRAL 240 by a scrub rate delta. The increase in memory scrub frequency occurs because the six error events exceed the DRAM error threshold 260 of five error events. Increasing the memory scrub frequency results in a shorter interval between memory scrubs. The second example includes the ECC system 224 reporting one actual error event in the memory 210 during the threshold window 290 resulting in the memory scrub frequency being decreased by the SRAL 240 by a scrub rate delta. The decrease in memory scrub frequency occurs because the single error event is less than the minimum error threshold 270 of two error events. The scrub rate delta for an increase may differ from the scrub rate delta for a decrease. Additionally, the scrub rate delta for either increases or decreases may be changed based, at least in part, on the memory scrub frequency. The threshold window 290 may also be adjusted based, at least in part, on the current memory scrub frequency.

While the SRAL 240 is illustrated external to memory 210, one skilled in the art will appreciate that in some examples the SRAL 240 may be internal to the EDS 220, to the scrub logic 230, or to combinations thereof.

Multiple DRAM error thresholds 260 and multiple minimum error thresholds 270 may be associated with different scrub rate deltas. For example, different scrub rate deltas may increase the memory scrub frequency dependent upon the TNEE reported as feedback during an ECI. Specifically, a doubling of the TNEE may result in a third scrub rate delta being used to adjust the memory scrub frequency while a tripling of the TNEE may result in a fourth scrub rate delta being used. The fourth scrub rate delta may increase the memory scrub frequency by a larger amount than the third scrub rate delta. In the case of the doubling of the TNEE, a first DRAM error threshold 260 may be exceeded. However in the case of the tripling of TNEE, a second larger DRAM threshold 260 may be exceeded. Thus, the different scrub rate deltas may adjust the memory scrub rate based upon which DRAM error threshold 260 is exceeded. Similarly, multiple minimum error thresholds may be implemented with different scrub rate deltas that decrease the memory scrub frequency. Additionally, scrub rate deltas may themselves be dynamically, automatically configurable based on a scrub rate delta change rate. For example, as the memory scrub frequency changes, the scrub rate delta may also be changed based, at least in part, on the change of the memory scrub frequency and/or the current memory scrub frequency.

The DRAM error threshold 260 and minimum error threshold 270 may also be updated as the average TNEE changes over time. For example, if the average TNEE tripled for an extended period, the DRAM error threshold value 260 may repeatedly be exceeded unless it is increased. If the DRAM error threshold 260 is not increased, assuming the threshold window 290 remains constant, a runaway increase in the memory scrub frequency may occur. This is an undesirable situation. For example, a runaway increase may continue until memory scrubs utilize one hundred percent of the processor cycles. Thus, example systems and methods may prevent the runaway situation by controlling the priority of the scrub process, limiting the total amount of cycles available to a scrub process, and so on. One skilled in the art will realize that a control system utilizing feedback may update the error thresholds used to adjust the system as the system set point (e.g. memory scrub frequency) is changed.

Preventing a runaway increase or decrease in memory scrub frequency may include adjusting the threshold window 290 by utilizing a sliding time window. The sliding time window may increase or decrease the threshold window 290 while allowing the DRAM error threshold 260 and/or the minimum error threshold 270 to remain constant. As the memory scrub frequency is increased the threshold window 290 may be shortened while maintaining a constant DRAM error threshold. As it still takes the same TNEE to exceed the same DRAM error threshold 260, the TNEE would have to occur during a shorter period of time (e.g. a shorter threshold window 290) to exceed the DRAM error threshold 260.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 3:
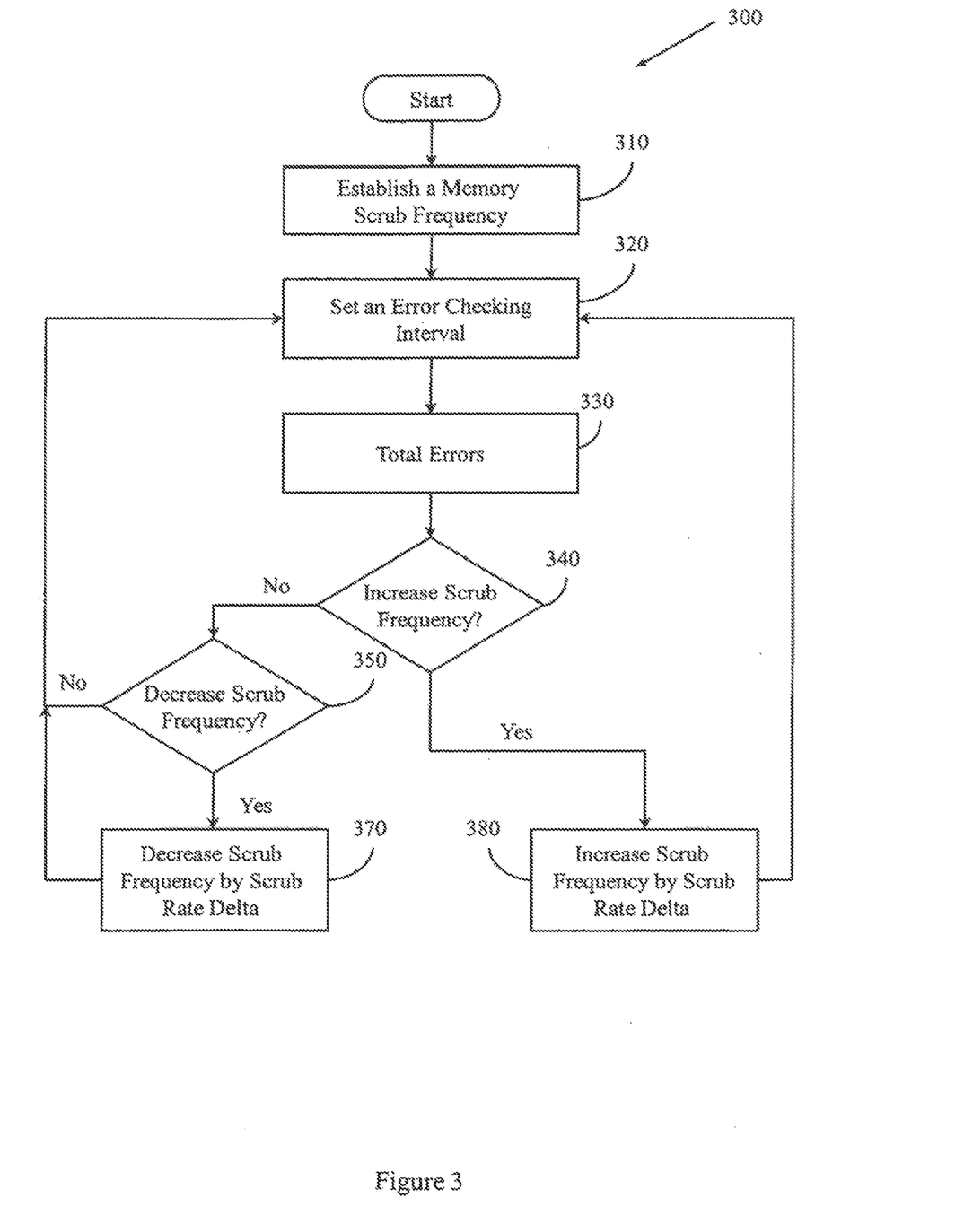
FIG. 3 illustrates an example method associated with selectively adjusting a memory scrub frequency.

FIG. 3 illustrates an example method 300 associated with establishing and selectively controlling a memory scrub frequency for periodically correcting error events in a memory. The method 300 may be performed for a memory device having error detection and correction capability. Method 300 may include, at 310, establishing a memory scrub frequency. The memory scrub frequency may be chosen based on the expected upset rate of the hardware. In one example, the SRAL 140 (FIG. 1) may perform action 310 and establish an initial memory scrub frequency based on the expected error event rate for the environment to which a device is to be deployed. This memory scrub frequency may be then be adjusted by the SRAL 140 (FIG. 1) performing method 300.

Method 300 may also include, at 320, setting an error checking interval (ECI). The ECI may be the period of time for which error events in the memory are calculated. The TNEE is to be checked against a maximum and minimum threshold value to determine whether the memory scrub frequency will be adjusted. For example, the SRAL 240 (FIG. 2) may use the ECI as the time interval (e.g. threshold window 290 (FIG. 2)) for which the TNEE reported by the EDS 220 (FIG. 2) is to be calculated. The TNEE during the ECI is the feedback reported by the EDS 220 to the SRAL 240.

Method 300 may also include, at 330, totaling a number of errors during an ECI. The totaling may occur as the result of an interrupt associated with the detection of an error. The totaling may depend on collecting the time stamps of the memory error events entered in a FIFO queue. This collecting may occur in real-time throughout method 300 and thus is not illustrated as a separate action. Entries older than the ECI may be purged. A number of error events in the FIFO queue may be totaled to calculate a TNEE during an ECI. The calculation of the TNEE during the ECI may be used by the SRAL 140 (FIG. 1) to determine whether the memory scrub frequency is to be adjusted.

Method 300 may also include, at 340, determining whether to increase the memory scrub frequency. The determination may be made, for example, by comparing the TNEE during the ECI to a DRAM error threshold. The DRAM error threshold is the number of error events that when exceeded may cause a memory scrub frequency increase. If the TNEE exceeds the DRAM error threshold, the memory scrub frequency is increased, at 380, by a first scrub rate delta. If the DRAM error threshold is not exceeded, as determined at 340, a determination of whether to decrease the scrub frequency is made at 350 by, for example, comparing the TNEE to a minimum error threshold. If the minimum error threshold exceeds the TNEE, then the memory scrub frequency is decreased, at 370, by a second scrub rate delta.

While FIG. 3 illustrates various actions occurring in serial, it is to be appreciated that various actions illustrated in method 300 could occur substantially in parallel. By way of illustration, a first process could establish a scrub frequency and ECI, a second process could total errors, and a third process could manipulate scrub frequencies. While three processes are described, it is to be appreciated that a greater and/or lesser number of processes could be employed and that lightweight processes, regular processes, threads, and other approaches could be employed.

In one example, a method may be implemented as computer executable instructions. Thus, in one example, computer-executable instructions to perform method 300 may be stored on a computer-readable medium encoded in a tangible logic. "Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. While executable instructions associated with method 300 are described as being stored on a computer-readable medium, it is to be appreciated that executable instructions associated with other example methods described herein may also be stored on a computer-readable medium.

Figure 4:
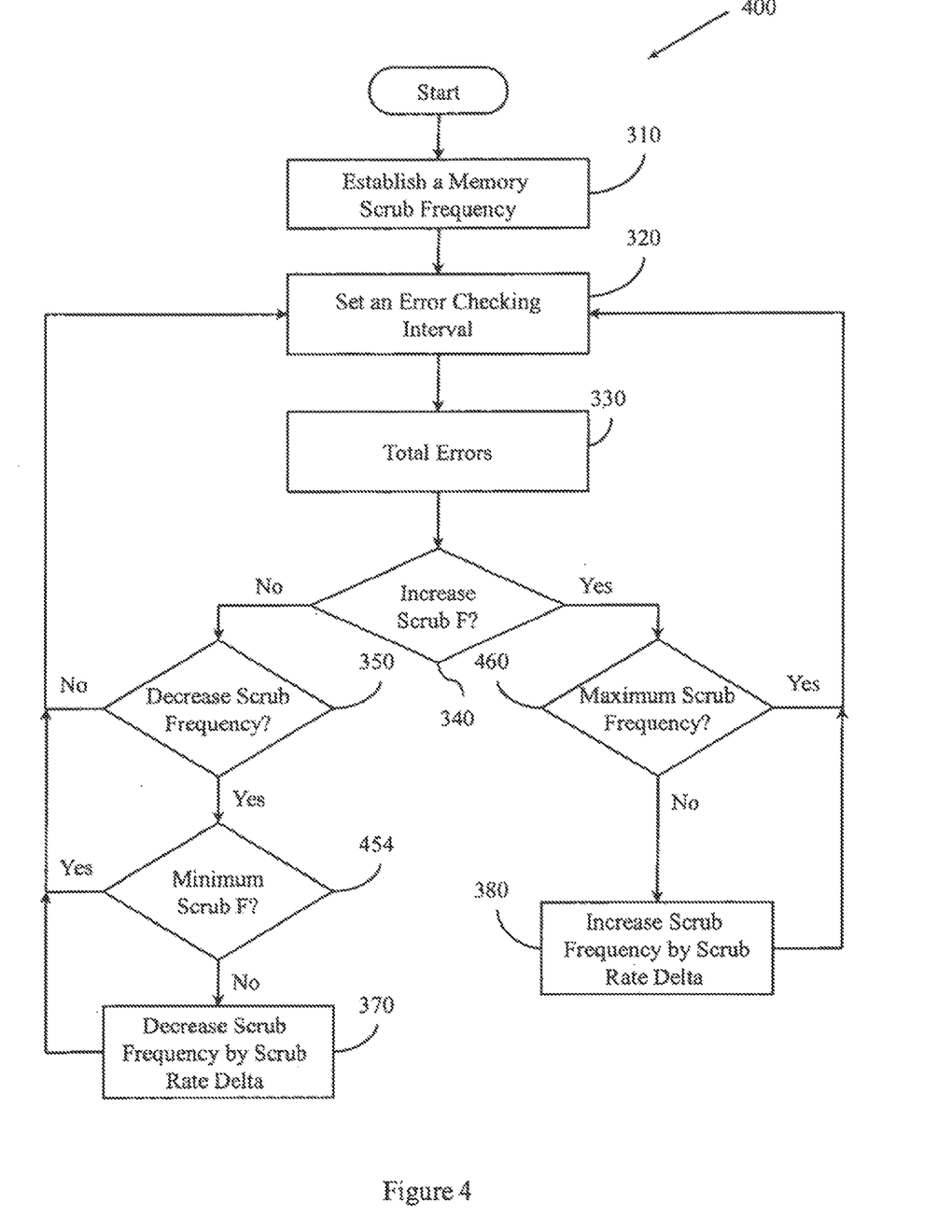
FIG. 4 illustrates another example method associated with selectively adjusting a memory scrub frequency.

FIG. 4 illustrates an example method 400 associated with establishing and adjusting a memory scrub frequency for periodically correcting errors in a memory. Method 400 includes some actions similar to those described in connection with method 300 (FIG. 3). For example, method 400 includes establishing a memory scrub frequency at 310, setting an error checking interval (ECI) at 320, totaling errors at 330, comparing the TNEE during the ECI to a set of error thresholds at 340 to determine whether to increase or decrease scrub frequency, increasing the memory scrub frequency by a first scrub rate delta at 380, determining whether to decrease the memory scrub frequency at 350, and decreasing the memory scrub rate frequency by a second scrub rate delta at 370. However, method 400 also includes additional actions.

For example, method 400 includes, at 454, comparing the current memory scrub frequency to a minimum scrub frequency threshold. The minimum scrub frequency threshold prevents the adjustment of the memory scrub frequency below a set threshold. If the current memory scrub frequency is equal to or less than the minimum scrub frequency threshold, the memory scrub frequency is not changed. If however, the current memory scrub frequency is greater than the minimum scrub frequency threshold, the memory scrub frequency is decreased, at 370, by a scrub rate delta.

Method 400 may also include, at 460, comparing the current memory scrub frequency to a maximum scrub frequency. The maximum scrub frequency determination compares the current memory scrub frequency to a maximum scrub frequency. The maximum scrub frequency prevents the adjustment of the memory scrub frequency above a threshold. For example, the threshold may prevent memory scrubs from using more than a desired percentage of processor cycles. If the current memory scrub frequency exceeds the maximum scrub frequency, the memory scrub frequency is not changed. If however, the memory scrub frequency is less than the maximum scrub frequency the memory scrub frequency is increased, at 380, by a scrub rate delta.

Figure 5:
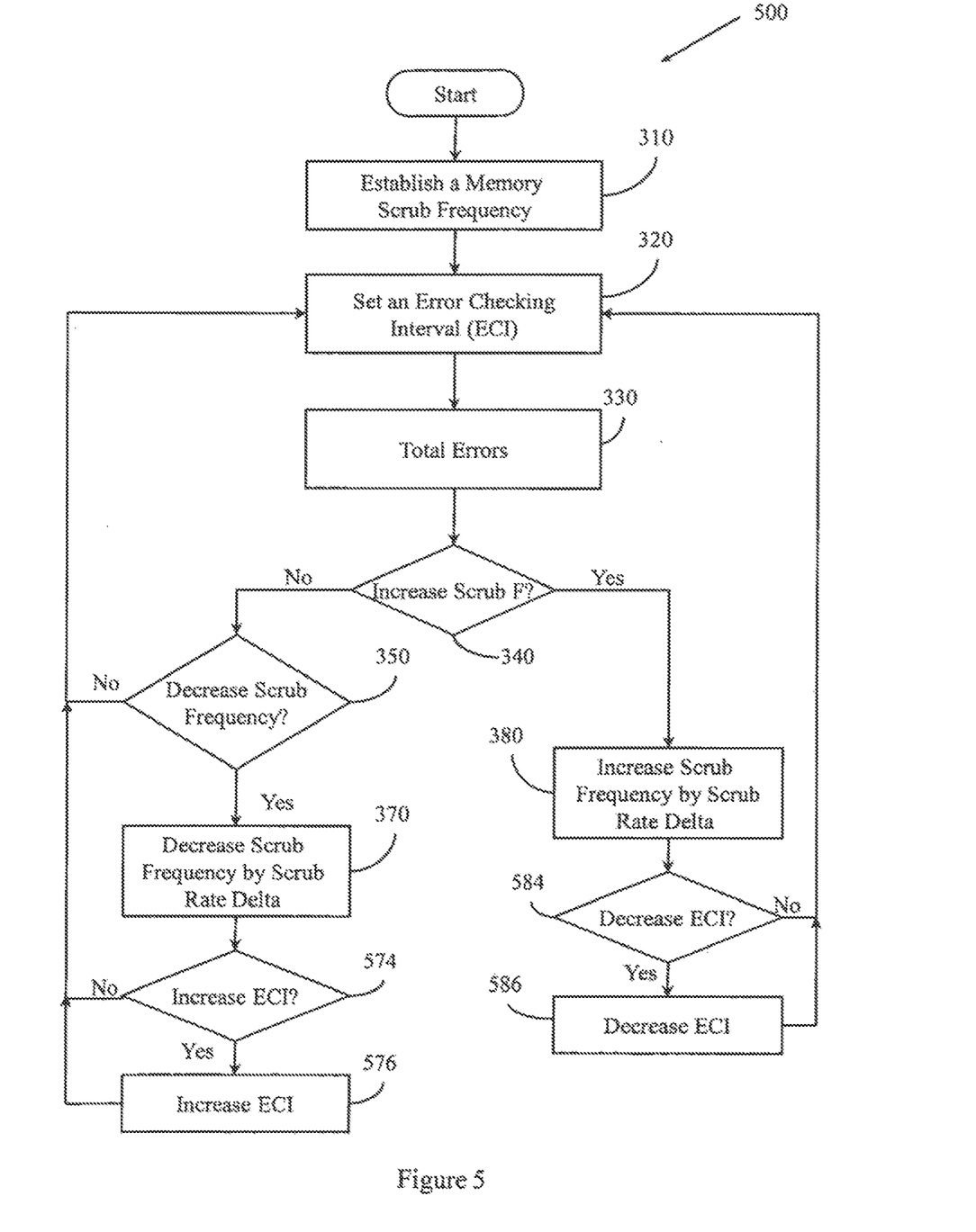
FIG. 5 illustrates another example method associated with selectively adjusting a memory scrub frequency.

FIG. 5 illustrates an example method 500 associated with establishing and adjusting a memory scrub frequency for periodically correcting errors in a memory. Method 500 includes some actions similar to those described in connection with method 300 (FIG. 3). For example, method 500 includes establishing a memory scrub frequency at 310, setting an ECI at 320, totaling errors at 330, determining whether to increase the memory scrub frequency at 340, increasing the memory scrub frequency by a first scrub rate delta at 380, determining whether to decrease the memory scrub frequency at 350, and decreasing the memory scrub rate frequency by a second scrub rate delta at 370. However, method 500 also includes additional actions.

For example, method 500 includes, at 574, determining whether the ECI should be increased. If the determination at 574 is yes, then the ECI is increased at 576. One skilled in the art will realize that a feedback based control system may update the thresholds or the intervals used to make set point adjustments (e.g. adjustments to the memory scrub frequency). An adjustable ECI or sliding time window facilitates adjusting the interval for gathering the TNEE. For example, as the memory scrub frequency is increased, the threshold window 290 (FIG. 2) may be shortened while maintaining a constant DRAM error threshold value 260 (FIG. 2). Thus, in the next iteration of method 500, an increase in the memory scrub frequency may still take the same TNEE to exceed the same DRAM error threshold 260 (FIG. 2) and to cause an increase in the memory scrub frequency. However, the same TNEE occurs during a shorter period of time. As a result a higher error event rate may increase the memory scrub frequency in the next iteration of method 500.

Method 500 may also include, at 584, determining if the ECI should be decreased. If the determination is yes, then the ECI is decreased at 586. As the memory scrub frequency is decreased, the threshold window 290 (FIG. 2) may be lengthened while maintaining a constant minimum error threshold value 260 (FIG. 2). Thus, in the next iteration of method 500, a decrease in the memory scrub frequency may still use the same TNEE that is less than the same minimum error threshold 270 and cause a decrease in the memory scrub frequency. However, the same TNEE occurs during a longer period of time. As a result a lower error event rate may decrease the memory scrub frequency in the next iteration of method 500.

Figure 6:
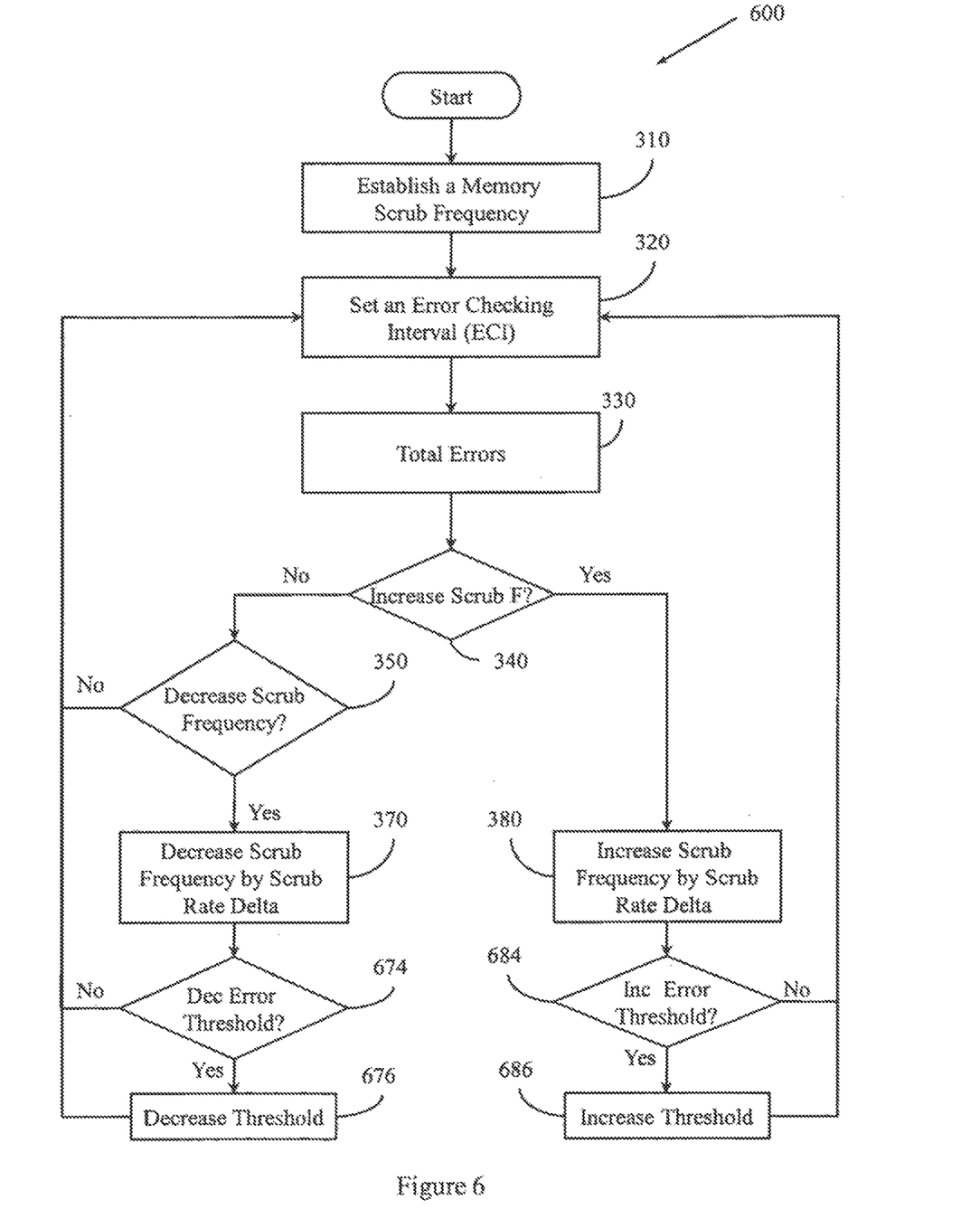
FIG. 6 illustrates another example method associated with selectively adjusting a memory scrub frequency.

FIG. 6 illustrates an example method 600 associated with establishing and adjusting a memory scrub frequency for periodically correcting errors in a memory. Method 600 includes some actions similar to those described in connection with method 300 (FIG. 3). For example, method 600 includes establishing a memory scrub frequency at 310, setting an ECI at 320, totaling errors at 330, determining whether to increase the memory scrub frequency at 340, increasing the memory scrub frequency by a first scrub rate delta at 380, determining whether to decrease the memory scrub frequency at 350, and decreasing the memory scrub rate frequency by a second scrub rate delta at 370. However, method 600 also includes additional actions.

For example, method 600 includes, at 674, determining whether to decrease the error threshold. If the determination at 674 is yes, then the error threshold may be decreased at 676. Method 600 may also include, at 684, determining whether to increase the error threshold. If the determination at 684 is yes, then the error threshold may be increased at 686.

Figure 7:
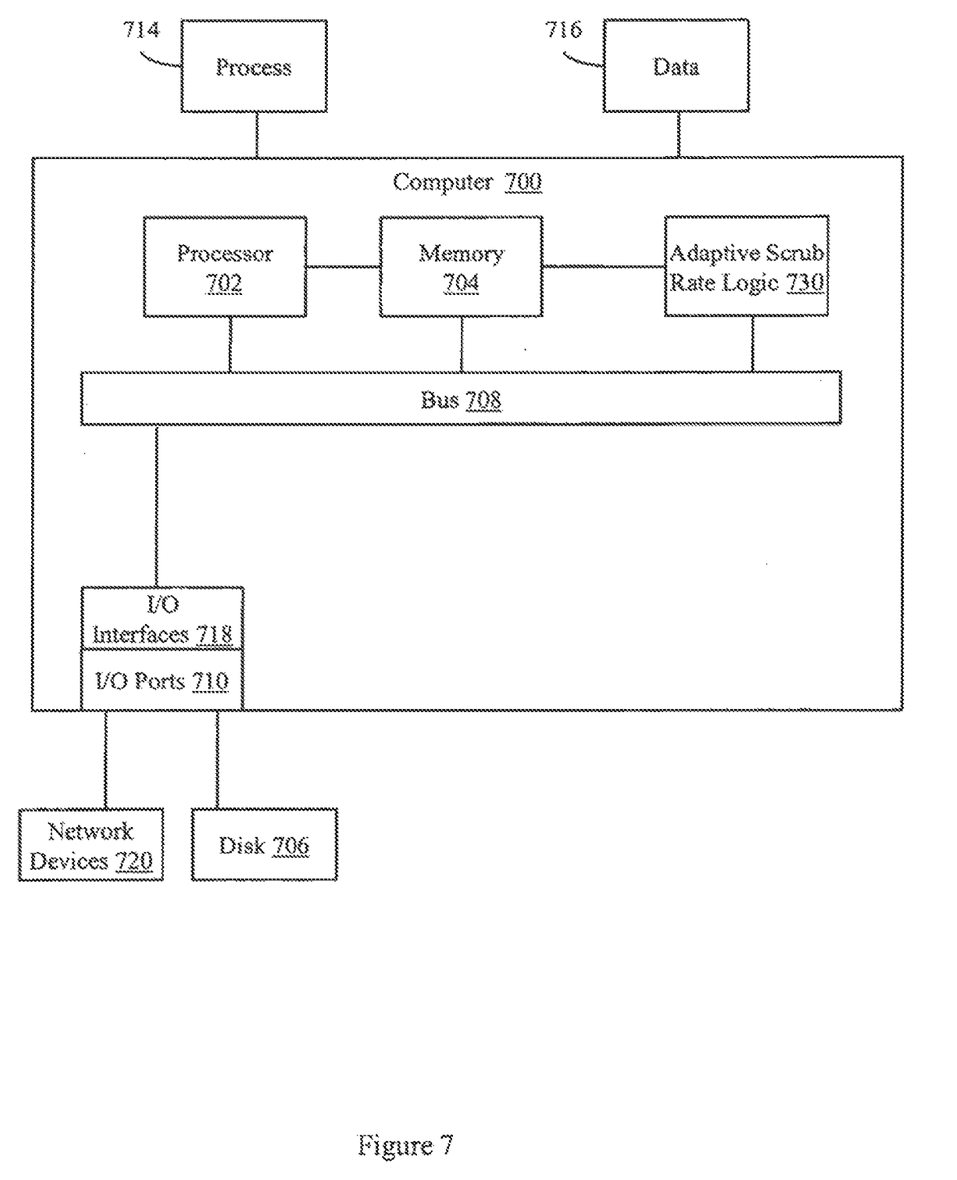
FIG. 7 illustrates an example computing environment in which example systems and methods, and equivalents, may operate.

FIG. 7 illustrates an example computing device in which example systems and methods described herein, and equivalents, may operate. The example computing device may be a computer 700 that includes a processor 702, a memory 704, and input/output ports 710 operably connected by a bus 708. In one example, the computer 700 may include an adaptive scrub rate logic 730 configured to facilitate adapting scrub rates to facilitate mitigating issues associated with event upsets. In different examples, the logic 730 may be implemented in hardware, software, firmware, and/or combinations thereof. While the logic 730 is illustrated as a hardware component attached to the bus 708, it is to be appreciated that in one example, the logic 730 could be implemented in the processor 702 and/or in the memory 704. In one example, the logic 730 may be implemented as a field programmable gate array (FPGA).

Thus, logic 730 may provide means (e.g., hardware, software, firmware) for detecting an error event in memory 704, where the error event involves at least one bit in the memory 704 changing state erroneously. The means may be implemented, for example, as an ASIC programmed to detect an error event in memory 704. Logic 730 may also provide means (e.g., hardware, software, firmware) for scrubbing the memory 704 to correct errors in the memory 704. The means may be implemented, for example, as an ASIC programmed to scrub memory 704. The means may also be implemented as computer executable instructions executed by processor 702. Logic 730 may also provide means (e.g., hardware, software, firmware) for determining whether to change a scrub frequency of the memory 704 based, at least in part, on a number of error events detected during an ECI.

Generally describing an example configuration of the computer 700, the processor 702 may be a variety of various processors including dual microprocessor and other multi-processor architectures. A memory 704 may include volatile memory and/or non-volatile memory. Non-volatile memory may include, for example, read only memory (ROM), programmable ROM (PROM), and so on. Volatile memory may include, for example, RAM, SRAM, DRAM, and so on.

A disk 706 may be operably connected to the computer 700 via, for example, an input/output interface (e.g., card, device) 718 and an input/output port 710. An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). The disk 706 may be, for example, a magnetic disk drive, a solid state disk drive, a floppy disk drive, a tape drive, a Zip drive, a flash memory card, a memory stick, and so on. Furthermore, the disk 706 may be a compact disk ROM (CDROM) drive, a CD-R drive, a CD-RW drive, a digital versatile disk (DVD) ROM, and so on. The memory 704 can store a process 714 and/or a data 716, for example. The disk 706 and/or the memory 704 can store an operating system that controls and allocates resources of the computer 700.

The bus 708 may be a single internal bus interconnect architecture and/or other bus or mesh architectures. While a single bus is illustrated, it is to be appreciated that the computer 700 may communicate with various devices, logics, and peripherals using other busses (e.g., PCIE, 1394, universal serial bus (USB), Ethernet). The bus 708 can be types including, for example, a memory bus, a memory controller, a peripheral bus, an external bus, a crossbar switch, and/or a local bus.

The computer 700 may interact with input/output devices via the i/o interfaces 718 and the input/output ports 710. Input/output devices may be, for example, a keyboard, a microphone, a pointing and selection device, cameras, video cards, displays, the disk 706, the network devices 720, and so on. The input/output ports 710 may include, for example, serial ports, parallel ports, and USB ports.

The computer 700 can operate in a network environment and thus may be connected to the network devices 720 via the i/o interfaces 718, and/or the i/o ports 710. Through the network devices 720, the computer 700 may interact with a network. Through the network, the computer 700 may be logically connected to remote computers. Networks with which the computer 700 may interact include, but are not limited to, a local area network (LAN), a wide area network (WAN), and other networks.

"Signal", as used herein, includes but is not limited to, electrical signals, optical signals, analog signals, digital Signals, data, computer instructions, processor instructions, messages, a bit, a bit stream, or other means that can be received, transmitted and/or detected.

"Software", as used herein, includes but is not limited to, one or more executable instruction, that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

I claim:

1. An apparatus, comprising:
   an error detection system (EDS) that detects an error event in a volatile memory, wherein the error event involves at least one bit in the volatile memory changing states erroneously;
   a scrub logic to scrub the volatile memory to correct an error in the volatile memory; and
   a scrub rate adaptive logic (SRAL) to selectively control a memory scrub frequency associated with the scrub logic by comparing a number of error events detected by the EDS during an error checking interval (ECI) to a plurality of error count thresholds, wherein each of the plurality of error count thresholds is associated with a respective scrub frequency change, and wherein the SRAL varies the memory scrub frequency based on a rate derived from at least one of the respective scrub frequency changes associated with at least one of the plurality of error count thresholds satisfied by the number of error events,
   wherein the SRAL adjusts at least one of (i) the ECI and (ii) one or more of the plurality of error count thresholds upon determining one of the plurality of error count thresholds is exceeded.

2. The apparatus of claim 1, wherein a first one of the plurality of error count thresholds represents a greater number of error events than a second one of the plurality of error count thresholds, wherein the scrub frequency change of the first error count threshold is greater than the scrub frequency change of the second error count threshold.

3. The apparatus of claim 2, wherein, upon determining the number of error events is equal to or greater than the first error count threshold, the SRAL varies the memory scrub frequency based on the scrub frequency change of the first error count threshold, and wherein, upon determining the number of error events is equal to or greater than the second error count threshold but less than the first error count threshold, the SRAL varies the memory scrub frequency based on the scrub frequency change of the second error count threshold.

4. The apparatus of claim 1, wherein the memory scrub frequency defines the interval between memory scrubs to correct the detected errors in the volatile memory.

5. The apparatus of claim 1, wherein the volatile memory is a DRAM.

6. The apparatus of claim 1, wherein the apparatus operates in a space vehicle located above one hundred kilometers from the surface of the earth.

7. A method, comprising:
  detecting an error event in a volatile memory, the error event involving at least one bit in the volatile memory changing states erroneously;
  correcting an error in the volatile memory based on scrub logic;
  selectively controlling a memory scrub frequency associated with the scrub logic by comparing a total number of error events detected during an error checking interval (ECI) to a plurality of error count thresholds, wherein each of the plurality of error count thresholds is associated with a respective scrub frequency change;
  varying the memory scrub frequency based on a rate derived from at least one of the respective scrub frequency changes associated with at least one of the plurality of error count thresholds satisfied by the number of error events; and
  adjusting at least one of (i) the ECI and (ii) one or more of the plurality of error count thresholds upon determining one of the plurality of error count thresholds is exceeded.

8. The method of claim 7, wherein a first one of the plurality of error count thresholds represents a greater number of error events than a second one of the plurality of error count thresholds, wherein the scrub frequency change of the first error count threshold is greater than the scrub frequency change of the second error count threshold.

9. The method of claim 8, wherein, upon determining the number of error events is equal to or greater than the first error count threshold, varying the memory scrub frequency based on the scrub frequency change of the first error count threshold, wherein, upon determining the number of error events is equal to or greater than the second error count threshold but less than the first error count threshold, varying the memory scrub frequency based on the scrub frequency change of the second error count threshold.

10. The method of claim 7, wherein the memory scrub frequency defines the interval between memory scrubs to correct the detected errors in the memory.

11. The method of claim 7, wherein the volatile memory is a DRAM.

12. An apparatus, comprising:
  an error detection system (EDS) to detect an error event in a random access memory (RAM), where the error event involves at least one bit in the RAM changing state erroneously;
  a scrub logic to scrub the RAM to correct an error in the RAM; and
  a scrub rate adaptive logic (SRAL) to selectively control a memory scrub frequency associated with the scrub logic based, at least in part, on comparing a number of error events detected by the EDS during an error checking interval (ECI) to an error threshold,
  wherein at least one of: (i) a duration of the ECI and (ii) the error threshold is varied based on the memory scrub frequency, and wherein a rate at which the memory scrub frequency is changed is based on the degree to which the number of error events one of: exceeds the error threshold and falls below the error threshold.

13. The apparatus of claim 12, wherein, upon determining the number of error events exceeds the error threshold, increasing the memory scrub frequency and at least one of decreasing the duration of the ECI and increasing the error threshold.

14. The apparatus of claim 12, wherein, upon determining the number of error events falls below the error threshold, decreasing the memory scrub frequency and at least one of increasing the duration of the ECI and decreasing the error threshold.

15. The apparatus of claim 12, wherein the rate at which the memory scrub frequency changes increase as the degree to which the number of error events one of: exceeds the error threshold and falls below the error threshold.

16. The apparatus of claim 12, wherein the number of error events is compared to a maximum error threshold and a minimum error threshold, wherein the maximum and minimum error thresholds are different, and wherein the memory scrub frequency increases if the number of error events exceeds the maximum error threshold and decreases if the number of error events falls below the minimum error threshold.

17. The apparatus of claim 12, wherein the SRAL partitions the RAM and selectively scrubs a memory partition of the RAM based on the location of error events in the RAM and a scrub priority of the memory partition, wherein the scrub priority of the memory partition depends on a predefined memory status.

* * * * *